United States Patent
Park et al.

(10) Patent No.: US 10,943,930 B2
(45) Date of Patent: Mar. 9, 2021

(54) DISPLAY DEVICE HAVING A MULTI-PATH STRUCTURE IN A BENDING REGION

(71) Applicant: Samsung Display Co., Ltd., Yongin-si (KR)

(72) Inventors: Gyung Soon Park, Seoul (KR); Hee Rim Song, Seoul (KR); Mu Kyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/454,815

(22) Filed: Jun. 27, 2019

(65) Prior Publication Data

US 2020/0006397 A1    Jan. 2, 2020

(30) Foreign Application Priority Data

Jun. 28, 2018 (KR) .......................... 10-2018-0074569

(51) Int. Cl.
*H01L 27/12* (2006.01)
*H01L 27/32* (2006.01)

(52) U.S. Cl.
CPC ...... *H01L 27/1244* (2013.01); *H01L 27/1218* (2013.01); *H01L 27/3276* (2013.01)

(58) Field of Classification Search
CPC ........................................................ H01L 27/12
See application file for complete search history.

(56) References Cited

U.S. PATENT DOCUMENTS

| | | | | |
|---|---|---|---|---|
| 2009/0122248 A1* | 5/2009 | Kim | .................. | G02F 1/136286 349/139 |
| 2012/0062447 A1* | 3/2012 | Tseng | ................ | G02F 1/133305 345/33 |
| 2014/0217397 A1* | 8/2014 | Kwak | .................. | H01L 27/1218 257/43 |
| 2016/0079336 A1* | 3/2016 | Youn | ................... | H01L 51/0097 257/40 |
| 2017/0358641 A1* | 12/2017 | Park | .................... | H01L 51/0097 |

* cited by examiner

*Primary Examiner* — Sheng-Bai Zhu
(74) *Attorney, Agent, or Firm* — H.C. Park & Associates, PLC

(57) ABSTRACT

A display device including a substrate having a first region, a second region, and a bending region disposed between the first region and the second region; and a plurality of bending connection lines disposed on the substrate in the bending region and extended in a first direction. Each of the bending connection lines includes a protrusion in a second direction and a recess depressed from the protrusion, and the protrusion of each of the bending connection lines faces the recess of the bending connection lines next thereto.

17 Claims, 10 Drawing Sheets

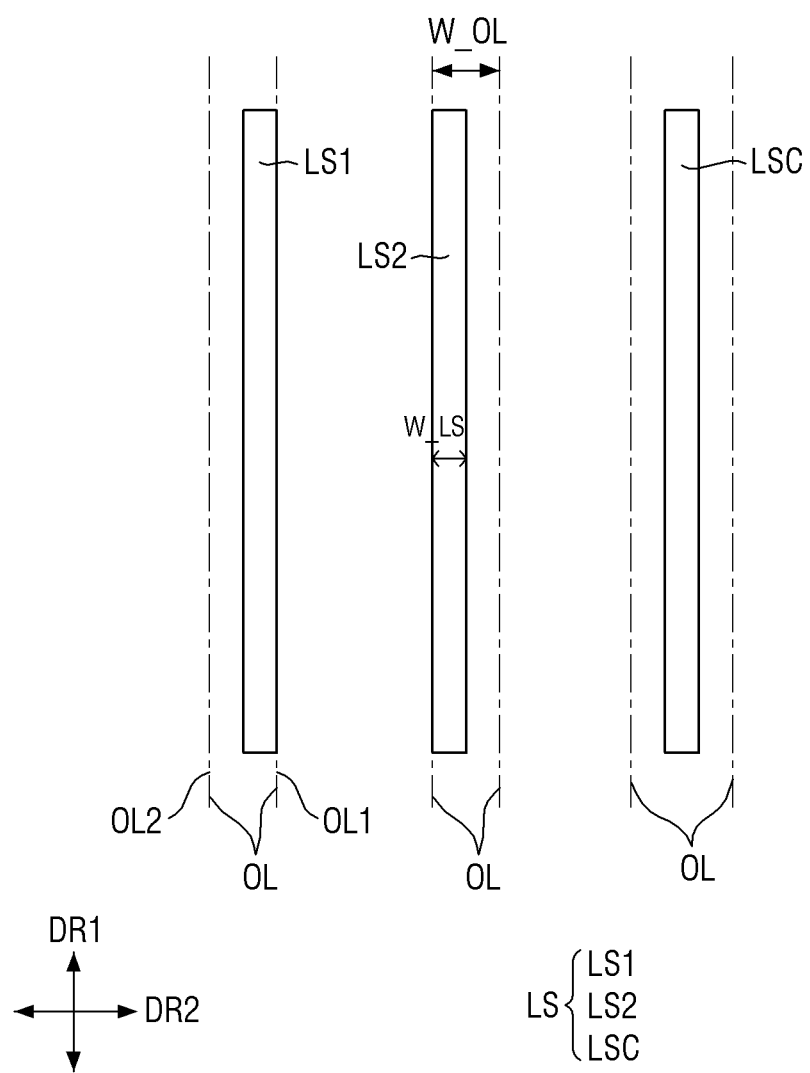

DISPLAY DEVICE HAVING A MULTI-PATH STRUCTURE IN A BENDING REGION

CROSS REFERENCE TO RELATED APPLICATION

This application claims priority from and the benefit of Korean Patent Application No. 10-2018-0074569, filed on Jun. 28, 2018, which is hereby incorporated by reference for all purposes as if fully set forth herein.

BACKGROUND

Field

Exemplary embodiments of the invention relate generally to a display device and, more specifically, to a display device including a bending structure.

Discussion of the Background

Display devices become more and more important as multimedia technology evolves. Accordingly, a variety of types of display devices, such as organic light-emitting display (OLED) devices and liquid-crystal display (LCD) devices, are currently in use.

Recently, in order to reduce a non-display area, there is ongoing research into a structure in which a driver for driving pixel circuits in a display area is disposed under the panel in the non-display area, and signal lines for connecting the panel with the driver are bent together. The width of the bending region may be reduced depending on the shape employed by a display device. It is still necessary to dispose an appropriate number of lines.

Incidentally, as the signal lines are bent, fractures and other defects may occur. To protect the signal lines, what is required is a multi-path structure.

The above information disclosed in this Background section is only for understanding of the background of the inventive concepts, and, therefore, it may contain information that does not constitute prior art.

SUMMARY

Exemplary embodiments of the present invention provide a display device having a multi-path structure with a high line density.

Additional features of the inventive concepts will be set forth in the description which follows, and in part will be apparent from the description, or may be learned by practice of the inventive concepts.

An exemplary embodiment of the present invention provides a display device including a substrate having a first region, a second region, and a bending region disposed between the first region and the second region; and a plurality of bending connection lines disposed on the substrate in the bending region and extended in a first direction. Each of the bending connection lines includes a protrusion in a second direction and a recess depressed from the protrusion, and the protrusion of each of the bending connection lines faces the recess of the bending connection lines next thereto.

Another exemplary embodiment of the present invention provides a display device including a substrate having a first region, a second region, and a bending region disposed between the first region and the second region; and a plurality of bending connection lines disposed on the substrate in the bending region and extended in a first direction. Each of the bending connection lines includes a line segment having a first width in a second direction intersecting with the first direction, and an extended segment having a second width in the second direction greater than the first width. The bending connection lines are arranged in the second direction, and each of the bending connection lines is a reference connection line or a swing connection line. The reference connection line includes a center line segment spaced apart from a first edge and a second edge of a first occupation line, and the first occupation line is occupied by the reference connection line in the first direction and the second edge is opposite to the first edge, a first edge extended segment aligned with the first edge and spaced apart from the second edge of the first occupation line, and a second edge extended segment aligned with the second edge and spaced apart from the first edge of the first occupation line. The swing connection line includes a center extended segment aligned with a first edge and a second edge of a second occupation line. The second occupation line is occupied by the swing connection line in the first direction and the second edge is opposite to the first edge, a first edge line segment aligned with the first edge and spaced apart from the second edge of the second occupation line, and a second edge line segment aligned with the second edge and spaced apart from the first edge of the second occupation line. The swing connection line includes a first swing connection line disposed adjacent to one side of the reference connection line in the second direction, and a second swing connection line disposed adjacent to one side of the first swing connection line in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7A is a view showing the positional relationship of line segments LS relative to an occupation line.

DETAILED DESCRIPTION

Figure 1:
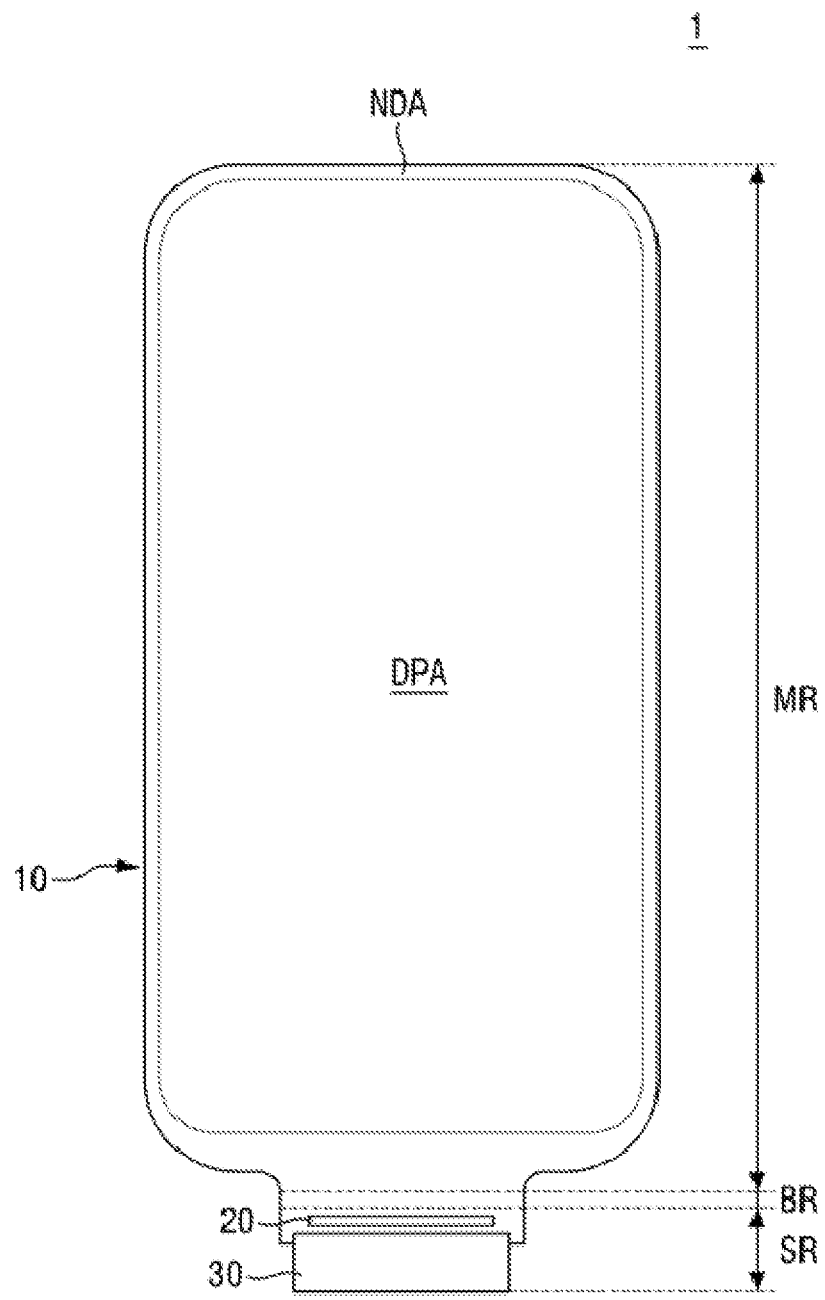
FIG. 1 is a plan view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the accompanying drawings.

Figure 2:
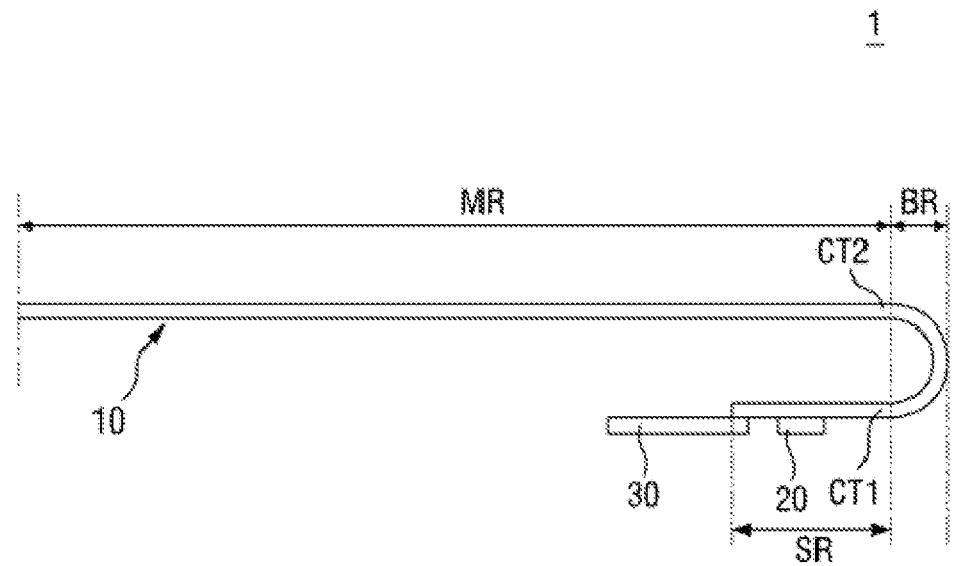
FIG. 2 is a cross-sectional view of a part of a display device according to an exemplary embodiment of the present invention.
Figure 3:
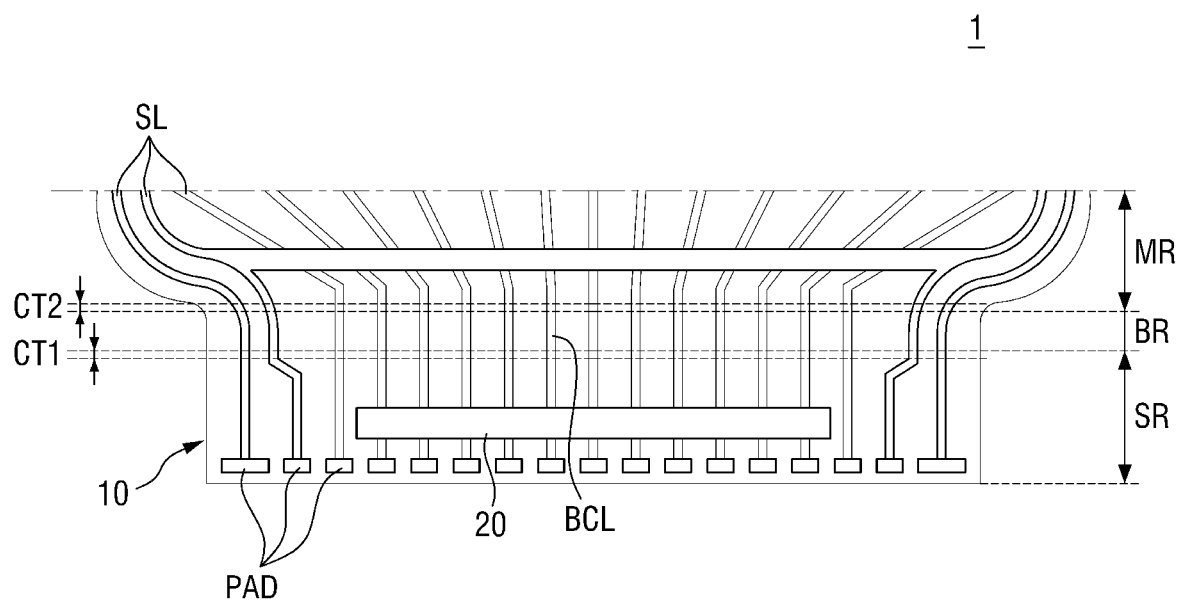
FIG. 3 is a view showing a layout of signal lines in a panel bending region according to an exemplary embodiment of the present invention.
Figure 4:
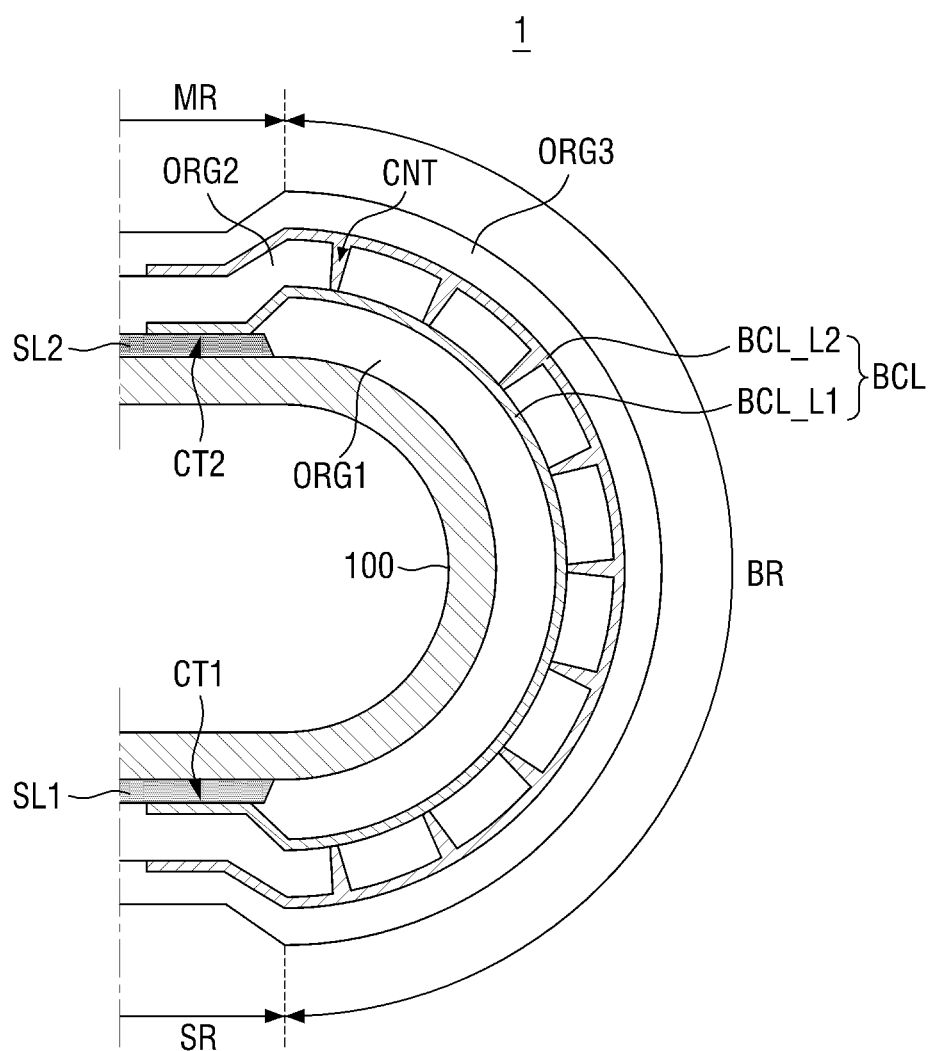
FIG. 4 is a cross-sectional view showing a layout of signal lines in a panel bending region according to an exemplary embodiment of the present invention.

FIG. 1 is a plan view of a display device according to an exemplary embodiment of the present invention. FIG. 2 is a cross-sectional view of a part of a display device according to an exemplary embodiment of the present invention. FIG. 3 is a view showing a layout of signal lines in a panel bending region according to an exemplary embodiment of the present invention. FIG. 4 is a cross-sectional view showing a layout of signal lines in a panel bending region according to an exemplary embodiment of the present invention.

In the plan view of FIG. 1, the upper, lower, left and right directions are defined for convenience of illustration. The upper-and-lower direction is the vertical direction or the column direction, and the left-and-right direction is the horizontal direction or the row direction. As used herein, "upper edge," "lower edge," "left edge," and "right edge" of a polarizing film and the like refer to edges or ends located on the upper side, the lower side, the left side and the right side of the polarizing film. It should be understood that the directions referred with respect to the exemplary embodiments are relative directions, and the exemplary embodiments are not limited to the directions mentioned.

Referring to FIGS. 1 to 4, a display device 1 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device, and a ultra mobile PC (UMPC), as well as the display screen of various products such as a television, a notebook, a monitor, a billboard and the Internet. Examples of the display device 1 may be an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device will be described as an example of display devices. It is, however, to be understood that is the inventive concepts are not limited thereto.

The display device 1 may include a display panel 10. The display panel 10 may include a flexible substrate including a flexible polymer material, such as polyimide. Accordingly, the display panel 10 may be curved, bent, folded, or rolled.

The display panel 10 may include a main region MR and a bending region BR connected to one side of the main region MR. The display panel 10 may further include a sub-region SR connected to the panel bending region BR and overlapped with the main region MR in the thickness direction.

An area of the display panel 10 in which images are displayed is defined as a display area DPA. An area of the display panel 10 in which no image is displayed is defined as a non-display area NDA. The display area DPA of the display panel 10 is disposed in the main region MR. The area other than the display area DPA serves as the non-display area NDA of the display panel 10. In an exemplary embodiment, the edge portion of the main region MR around the display area DPA, the entire panel bending region BR, and the entire sub-region SR may be a non-display area NDA. It is, however, to be understood that the inventive concepts are not limited thereto. The panel bending area BR and/or the sub-region SR may also include the display area DPA.

The main region MR may have a shape generally similar to that of the display device 1 when viewed from the top. The main region MR may be a flat area located in one plane. It is, however, to be understood that the inventive concepts are not limited thereto. At least one of the edges of the main region MR, except for the edge (side) connected to the panel bending region BR, may be bent to form a curved surface, or may be bent at a right angle.

The display area DPA of the display panel 10 may be disposed at the center of the main region MR. The display area DPA may include pixels. Each of the pixels may include an emissive layer and a circuit layer for controlling the amount of light emitted from the emissive layer. The circuit layer may include a display line, a display electrode, and at least one transistor. The emissive layer may include an organic light-emitting material. The emissive layer may be sealed by an encapsulation layer. The configuration of each of the pixels will be described in detail later.

The display area DPA may have a rectangular shape or a rectangular shape with rounded corners. It is, however, to be understood that the inventive concepts are not limited thereto. The display area DPA may have various shapes, such as a square or other polygonal or circular shape, elliptical shape, etc.

When at least one of the edges of the main region MR, except for the edge (side) connected to the panel bending region BR, is bent to form a curved surface or bent at a right angle, the display area DPA may also be disposed at the edge. It is, however, to be understood that the inventive concepts are not limited thereto. The non-display area NDA that does not display an image may be disposed on the curved or bent edge, or the display area DPA and the non-display area NDA may be disposed together.

In the main region MR, the non-display area NDA may be located around the display area DPA. In the main region MR, the non-display area NDA may be extended from the outer boundary of the display area DPA to the edge of the display panel 10. In the non-display area NDA of the main region MR, signal lines SL for applying signals to the display area DPA or driving circuits may be disposed. An outermost black matrix may be, but is not limited to being, disposed in the non-display area NDA of the main region MR.

The panel bending region BR is connected to the main region MR. For example, the panel bending region BR may be connected to a shorter side of the main region MR. The width of the panel bending region BR may be less than the width (width of a shorter side) of the main region MR. The portions where the main region MR meets the panel bending region BR may be cut in an L-shape.

In the panel bending region BR, the display panel 10 may be bent downward in the thickness direction, i.e., in the direction away from the display surface with a curvature. Although the panel bending region BR may have a constant radius of curvature, the inventive concepts are not limited thereto. The panel bending region BR may have different radii of curvature for difference sections. As the display panel 10 is bent in the panel bending region BR, the surface of the display panel 10 is reversed. Specifically, the surface of the display panel 10 facing upward may be bent such that it faces outward in the panel bending region BR and faces downward.

The sub-region SR is extended from the panel bending region BR. The sub-region SR may be extended in a direction parallel to the main region MR after the display device has been bent. The sub-region SR may overlap with the main region MR in the thickness direction of the display panel 10. The sub-region SR may overlap with the non-display area NDA at the edge of the main region MR and may also overlap with the display area DPA of the main region MR.

The width of the sub-region SR may be, but is not limited to being, equal to the width of the panel bending region BR.

A driving chip 20 may be disposed on the sub-region SR of the display panel 10. The driving chip 20 may include an integrated circuit for driving the display panel 10. In an exemplary embodiment, the integrated circuit may be, but is not limited to, a data driving integrated circuit that generates and provides a data signal. The driving chip 20 may be mounted on the display panel 10 in the sub-region SR. The driving chip 20 is mounted on the surface of the display panel 10 which is the display surface. As the panel bending region BR is bent and reversed as described above, the driving chip 20 is mounted on the surface of the display panel 10 facing downward in the thickness direction, such that the upper surface of the driving chip 20 may face downward.

The driving chip 20 may be attached on the display panel 10 by an anisotropic conductive film or on the display panel 10 by ultrasonic bonding. The lateral width of the driving chip 20 may be less than the lateral width of the display panel 10. The driving chip 20 is disposed at the center in the lateral direction of the sub-region SR and the left and right edges of the driving chip 20 may be spaced apart from the left and right edges of the sub-region SR, respectively.

A pad unit PAD may be provided at the end of the sub-region SR of the display panel 10, and a display driving substrate 30 may be connected to the pad unit PAD. The display driving substrate 30 may be a flexible printed circuit board or a film.

Signal lines SL may be disposed in the sub-region SR, the panel bending region BR, and the main region MR. The signal lines SL may be extended from the sub-region SR to the main region MR via the panel bending region BR. Some of the signal lines SL (e.g., a first power line and a second power line) may be extended from the end of the sub-region SR to the panel bending region BR and in turn to the main region MR without passing through the driving chip 20. Some others of the signal lines SL (e.g., a data signal line) may be extended from the end of the sub-region SR to the panel bending region BR and in turn to the main region MR through the driving chip 20. The signal lines SL, which pass through the driving chip 20, may form a fan-out area that widens toward the main region MR from the sub-region SR and/or panel bending region BR so as to entirely cover the main region MR having a width greater than that of the driving chip 20. The signal lines SL which bypass the driving chip 20 may travel on the outer sides of the signal line SL passing through the driving chip 20.

The signal lines SL passing through the panel bending region BR are bent together with the panel, and accordingly, the signal lines SL may be subjected to bending stress. Such bending stress may cause cracking or disconnection of the signal lines SL. To prevent this, the signal lines SL passing through the panel bending region BR may be formed of a more flexible material. The signal lines SL passing through the panel bending region BR can have a multi-path structure in which multiple line layers are electrically connected with one another through contacts in the vertical direction, so that even when one line layer is disconnected, a signal can be transmitted through another line layer electrically connected thereto.

On the other hand, since the panel bending region BR has a relatively small width, the signal lines SL passing through the panel bending region BR are more densely disposed therein. When a contact is made in the vertical direction between the line layers in order to implement the multi-path structure, the width of the portion where the contact is made is relatively wide, such that a short circuit with another signal line SL may be created. To prevent this, the spacing between the signal lines SL may be increased. However, this may decrease the number of signal lines SL that can be disposed within a limited width. In view of the above, by way of adjusting the shape and arrangement of the portions where the line layers come in contact with one another as will be described below, it is possible to dispose a sufficient number of signal lines SL while maintaining an appropriate gap with the adjacent signal lines SL. In other words, the number of signal lines SL can be increased within a predetermined area (width). This will be described in detail below.

Contact portions CT1 and CT2 may be formed adjacent to the panel bending region BR. For example, a first contact portion CT1 may be formed at the sub-region SR adjacent to the panel bending region BR or at the boundary thereof. A second contact portion CT2 may be formed at the main region SR adjacent to the panel bending region BR or at the boundary thereof.

A signal line SL traversing at least a part of the panel bending region BR (hereinafter referred to as a "bending signal line") may move to another line layer while passing through the first contact portion CT1 and the second contact portion CT2. For example, the bending signal lines may include a first signal line SL1 located in the sub-region SR and formed of a first line layer, a second signal line SL2 located in the main region MR and formed of a second line layer, and a bending connection line BCL located in the panel bending region BR and formed of another line layer different from the first line layer and the second line layer. The bending connection line BCL may include a first connection line layer BCL_L1 formed of a third line layer, and a second connection line layer BCL_L2 formed of a fourth line layer and connected to the first connection line layer BCL_L1 through a contact CNT.

In an exemplary embodiment, a first signal line SL1 and a second signal line SL2 may be disposed on the substrate 100, a first organic material layer ORG1 on the first signal line SL1 and the second signal line SL2, a first connection line layer BCL_L1 may be disposed on the first organic material layer ORG1, a second organic material layer ORG2 may be disposed on the first connection line layer BCL_L1, a second connection line layer BCL_L2 may be disposed on the second organic material layer ORG2, and a third organic material layer ORG3 may be disposed on the second connection line layer BCL_L2, to protect them. The contact CNT of the first connection line layer BCL_L1 and the second connection line layer BCL_L2 may be made by a contact hole passing through the second organic material layer ORG2. The first connection line layer BCL_L1 and the second connection line layer BCL_L2 electrically connected with each other through the contact CNT may form the above-described multi-path structure.

The first signal line SL1 may be extended from the sub-region SR to the main region MR and may come in contact with a bending connection line BCL disposed on a layer different from the first line layer (e.g., the third line layer) in the first contact portion CT1. The bending connection line BCL may be extended to the second contact portion CT2 through the panel bending region BR and may come in contact with a second line layer disposed on a layer different from the line layer of the bending connection line BCL in the second contact portion CT2. The second line layer may be located in the same layer as the above-described first line layer or may be located in another layer. The second line layer may be extended to the display portion DPA in the main region MR.

In an exemplary embodiment, the first signal line SL1 has one end terminated at the first contact portion CT1, the bending connection line BCL has both ends terminated at the first contact portion CT1 and the second contact region CT2, and the second signal line SL2 has the other end terminated at the second contact portion CT2. It is, however, to be understood that the inventive concepts are not limited thereto. The line layer of at least a part of the bending signal line may be further extended around the contact portions CT1 and CT2.

Some signal lines SL may be extended without any contact with other line layers in the first contact portion CT1 or the second contact portion CT2. For example, if some bending signal lines are is formed of the third line layer in the sub-region SR or the main region MR, the bending signal line may be extended as it is by using the third line layer without any contact with the other line layers when passing the panel bending area BR through the first contact portion CT1 and the second contact portion CT2.

The third line layer and the fourth line layer passing through the panel bending region BR may include a material more robust to bending than the first line layer or the second line layer. For example, the third line layer and the fourth line layer may include a material having better flexibility than the first line layer and the second line layer. This makes it possible to prevent damage to the lines due to bending stress in the panel bending region BR. The first line layer and the second line layer may be the same line layer. For example, each of the first line layer and the second line layer may be a first gate conductive layer, and the third line layer may include a first source/drain conductive layer and a second source/drain conductive layer.

Hereinafter, an exemplary cross-sectional structure of the above-described display device 1 will be described in detail.

Figure 5:
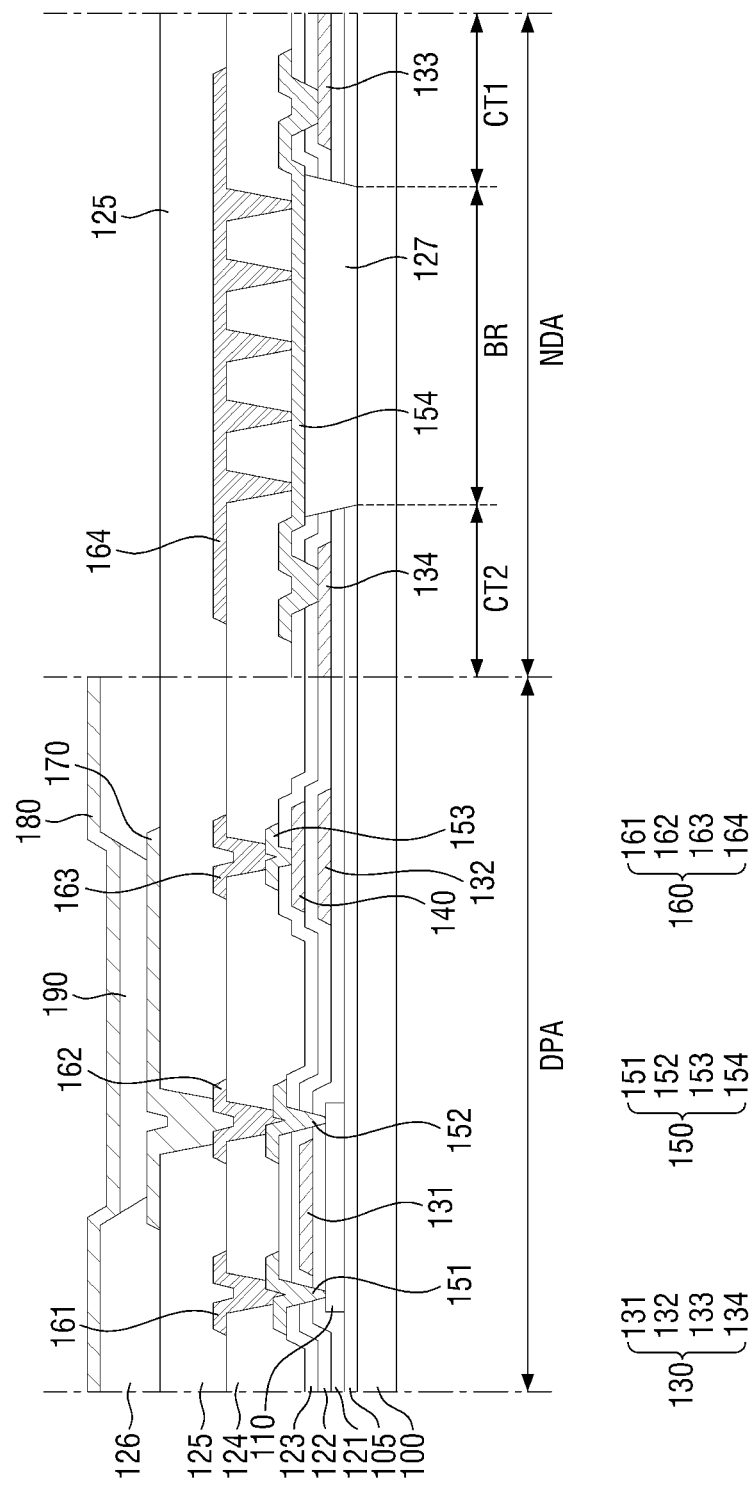
FIG. 5 is a cross-sectional view showing a cross section of one pixel as well as a cross section of a non-display area of a display device according to an exemplary embodiment of the present invention.

FIG. 5 is a cross-sectional view showing a cross section of one pixel as well as a cross section of a non-display area of a display device according to an exemplary embodiment of the present invention.

The cross sectional structure of the display device 1 is described with reference to FIG. 5. A stack structure of an organic light-emitting display device may include a substrate 100, a buffer layer 105, a semiconductor layer 110, a first insulating layer 121, a first conductive layer 130, a second insulating layer 122, a second conductive layer 140, a third insulating layer 123, a bending insulating layer 127, a third conductive layer 150, a fourth insulating layer 124, a fourth conductive layer 160, a fifth insulating layer 125, a fifth conductive layer 170, a pixel defining layer 126 including an opening for exposing the fifth conductive layer 170, an organic layer 190 disposed within the opening of the pixel defining layer 126, and a sixth conductive layer 180 disposed on the organic layer 190 and the pixel defining layer 126. Each of the layers described above may be made up of a single layer, or a stack of layers including a plurality of layers. Other layers may be further disposed between the layers.

The substrate 100 supports the layers disposed thereon. The substrate 100 may be made of an insulating material, such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 100 may be a flexible substrate that can be bent, folded, or rolled. An example of the material of the flexible substrate may be, but is not limited to, polyimide (PI).

The buffer layer 105 is disposed on the substrate 100. The buffer layer 105 may prevent impurity ions from diffusing, may prevent permeation of moisture or outside air, and may provide a flat surface. The buffer layer 105 may include silicon nitride, silicon oxide, silicon oxynitride, or the like. The buffer layer 105 covers most of the display area DA and the non-display area NDA of the substrate 100. However, a part of the buffer layer 105 may be removed in the panel bending area BR to expose the surface of the substrate 100. The buffer layer 105 may be eliminated depending on the type of the substrate 100, process conditions, etc.

The semiconductor layer 110 is disposed on the substrate 105. The semiconductor layer 110 forms a channel of a thin-film transistor of the pixel. The semiconductor layer 110 may include polycrystalline silicon. It is, however, to be understood that the inventive concepts are not limited thereto. The semiconductor layer 110 may include monocrystalline silicon, low-temperature polycrystalline silicon, amorphous silicon, or an oxide semiconductor. The oxide semiconductor may include, for example, a binary compound ($AB_x$), a ternary compound ($AB_xC_y$) and a quaternary compound ($AB_xC_yD_z$) containing indium, zinc, gallium, tin, titanium, aluminum, hafnium (Hf), zirconium (Zr), magnesium (Mg), etc.

The first insulating layer 121 may be a gate insulating layer having a gate insulating function. The first insulating layer 121 may include a silicon compound, a metal oxide, etc. For example, the first insulating layer 121 may include silicon oxide, silicon nitride, silicon oxynitride, aluminum oxide, tantalum oxide, hafnium oxide, zirconium oxide, titanium oxide, etc. They may be used alone or in combinations. The first insulating layer 121 may be made up of a single layer or multiple layers of different materials stacked on one another.

The first insulating layer 121 is disposed on the semiconductor layer 110 and may be disposed over the entire surface of the substrate 100. It is to be noted that the first insulating layer 121 may be removed together with the buffer layer 105 in a part of the panel bending region BR to expose the surface of the substrate 100.

The first conductive layer 130 is disposed on the first insulating layer 121. The first conductive layer 130 may be a first gate conductive layer. The first conductive layer 130 may include a gate electrode 131 of the thin-film transistor of the pixel and a scan line connected thereto, and a first electrode 132 of a storage capacitor.

The first conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu). The first conductive layer 130 may be made up of a single layer or multiple layers.

The second insulating layer 122 may be disposed on the first conductive layer 130. The second insulating layer 122 may be an interlayer dielectric layer. The second insulating layer 122 may include an inorganic insulating material, such as silicon oxide, silicon nitride, silicon oxynitride, hafnium oxide, aluminum oxide, titanium oxide, tantalum oxide, and zinc oxide.

The second conductive layer 140 is disposed on the second insulating layer 122. The second conductive layer 140 may be a second gate conductive layer. The second conductive layer 140 may include a second electrode 140 of the storage capacitor. The second conductive layer 140 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu). The second conductive layer 140 may be made of, but is not limited to, the same material as the first conductive layer 130. The second conductive layer 140 may be made up of a single layer or multiple layers.

At least one of the first conductive layer 130 and the second conductive layer 140 may include a first signal line SL1 and/or a second signal line SL2, which form the bending signal line. That is to say, among the signal lines SL in the non-display area, the first signal line SL1 disposed in the sub-region SR and the second signal line SL2 disposed in the main region MR may be formed of the first conductive layer 130 or the second conductive layer 140. Although the first signal line SL1 (133) disposed in the sub-region SR around the panel bending region BR and the second signal line SL2 (134) disposed in the main region MR are formed of the first conductive layer 130 in the example shown in the drawings, both of the first signal line SL1 and the second signal line SL2 may be formed of the second conductive layers 140, or one of them may be formed of the first conductive layer 130 while the other may be formed of the second conductive layer 140.

A third insulating layer 123 is disposed on the second conductive layer 140. The third insulating layer 123 may be an interlayer dielectric layer. The third insulating layer 123 may include an inorganic insulating material, such as silicon oxide, silicon nitride, silicon oxynitride, hafnium oxide, aluminum oxide, titanium oxide, tantalum oxide, and zinc oxide, or an organic insulating material such as a polyacrylate resin, an epoxy resin, a phenolic resin, a polyamide resin, a polyimide resin, a unsaturated polyester resin, a polyphenylenether resin, a polyphenylenesulfide resin, and benzocyclobutene (BCB). The third insulating layer 123 may be made up of a single layer or multiple layers of different materials stacked on one another.

The bending insulating layer 127 may be disposed in the panel bending region BR. The panel bending region BR may include a bending opening. The bending opening may be formed by removing the buffer layer 105, the first insulating layer 121, the second insulating layer 122, and the third insulating layer 123, to expose the upper surface of the substrate 100. The bending insulating layer 127 may be used to fill the bending opening. The bending insulating layer 127 may be a via layer. The signal lines SL in the panel bending region BR may pass above the bending insulating layer 127.

The bending insulating layer 127 may include an organic insulating material such as a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

The third conductive layer 150 is disposed on the third insulating layer 123. The third conductive layer 150 may be a first source/drain conductive layer. The third conductive layer 150 may include a first electrode 151 and a second electrode 152 of the thin-film transistor of the pixel. The first electrode 151 and the second electrode 12 of the thin-film transistor may be electrically connected to the source region and the drain region of the semiconductor layer 110, respectively, through contact holes passing through the third insulating layer 123, the second insulating layer 122 and the first insulating layer 121. The first supply voltage electrode 153 and the first connection line layers BCL_L1 (154) that traverses the panel bending region BR of the pixel may also be formed of the third conductive layer 150.

The third conductive layer 150 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 150 may be made up of a single layer or multiple layers. For example, the third conductive layer 150 may have a stack structure of Ti/Al/Ti, Mo/Al/Mo, Mo/AlGe/Mo, and Ti/Cu.

The fourth insulating layer 124 is disposed on the third conductive layer 150. The fourth insulating layer 124 covers the third conductive layer 150. The fourth insulation layer 124 may be a via layer. The fourth insulating layer 124 may include the same material as the above-described bending insulating layer 127, or may include one or more materials selected from the materials listed above as the materials of the bending insulating layer 127.

The fourth conductive layer 160 is disposed on the fourth insulating layer 124. The fourth conductive layer 160 may be a second source/drain conductive layer. The fourth conductive layer 160 may include a data line 161, a connection electrode 162, and a first supply voltage line 163 of the pixel. In the pixel, the data line 161 may be electrically connected to the first electrode 151 of the thin-film transistor of the pixel through a contact hole penetrating through the fourth insulating layer 124. The connection electrode 162 may be electrically connected to the second electrode 152 of the thin-film transistor of the pixel through the contact hole passing through the fourth insulating layer 124. The first supply voltage line 163 may be electrically connected to the first supply voltage electrode 153 through a contact hole passing through the fourth insulating layer 124.

The fourth conductive layer 160 may further include a second connection line layer BCL_L2 (164) traversing the panel bending region BR. The second connection line layer BCL_L2 (164) may be electrically connected to the first connection line layer BCL_L1 (151) through at least one contact hole formed in the fourth insulating layer 124.

The fourth conductive layer 160 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be made up of a single layer or multiple layers. The fourth conductive layer 160 may be made of, but is not limited to, the same material as the third conductive layer 150.

In an exemplary embodiment, each of the third conductive layer 150 forming the first connection line layer BCL_L1 (154) and the fourth conductive layer 160 forming the second connection line layer BCL_L2 (164) may include aluminum that is a material having flexibility. For example, the third conductive layer 150 and the fourth conductive layer 160 may include a Ti/Al/Ti laminated film.

The fifth insulating layer 125 is disposed on the fourth conductive layer 160. The fifth insulating layer 125 covers the fourth conductive layer 160. The fifth insulation layer 125 may be a via layer. The fifth insulating layer 125 may include the same material as the above-described bending insulating layer 127 or may include one or more materials selected from the materials listed above as the materials of the bending insulating layer 127.

The fifth conductive layer 170 is disposed on the fifth insulating layer 125. The anode electrode of the pixel may be made of the fifth conductive layer 170. The anode electrode may be electrically connected to the connection electrode 162 formed of the fourth conductive layer 160 through the contact hole formed in the fifth insulating layer 125 and may be connected to the second electrode 152 of the thin-film transistor therethrough.

The fifth conductive layer 170 may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca), or a mixture thereof. The layer having a high work function may be disposed above the reflective material layer so that it is disposed closer to the organic layer 190. The fifth conductive layer 170 may have, but is not limited to, a multilayer structure of ITO/Mg, ITO/MgF, ITO/Ag, and ITO/Ag/ITO.

The pixel defining layer 126 may be disposed on the fifth conductive layer 170. The pixel defining layer 126 may include an opening exposing the fifth conductive layer 170. The pixel defining layer 123 may include an inorganic insulating material, such as silicon oxide, silicon nitride, silicon oxynitride, hafnium oxide, aluminum oxide, titanium oxide, tantalum oxide, and zinc oxide, or an organic insulating material, such as a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB). The pixel defining layer 126 may be made up of a single layer or multiple layers of different materials stacked on one another.

An organic layer 190 is disposed in the opening of the pixel defining layer 126. The organic layer 190 may include an organic emissive layer, a hole injecting/transporting layer, and an electron injecting/transporting layer. Although the hole injecting/transporting layer and the electron injecting/transporting layer are formed as a single layer in the example shown in the drawings, they may be made up of multiple layers of the injecting layer and the transporting layer.

A sixth conductive layer 180 is disposed on the organic layer 190 and the pixel defining layer 126. The cathode electrode may be implemented as the sixth conductive layer 180. The cathode electrode CAT may be disposed over throughout the display area. The sixth conductive layer 180 may include a material layer having a small work function such as Li, Ca, LiF/Ca, LiF/Al, Al, Mg, Ag, Pt, Pd, Ni, Au, Nd, Ir, Cr, BaF, Ba, or a compound or mixture thereof. The sixth conductive layer 180 may further include a transparent metal oxide layer disposed on the material layer having a small work function.

Hereinafter, the bending connection line BCL will be described in more detail.

Figure 6:
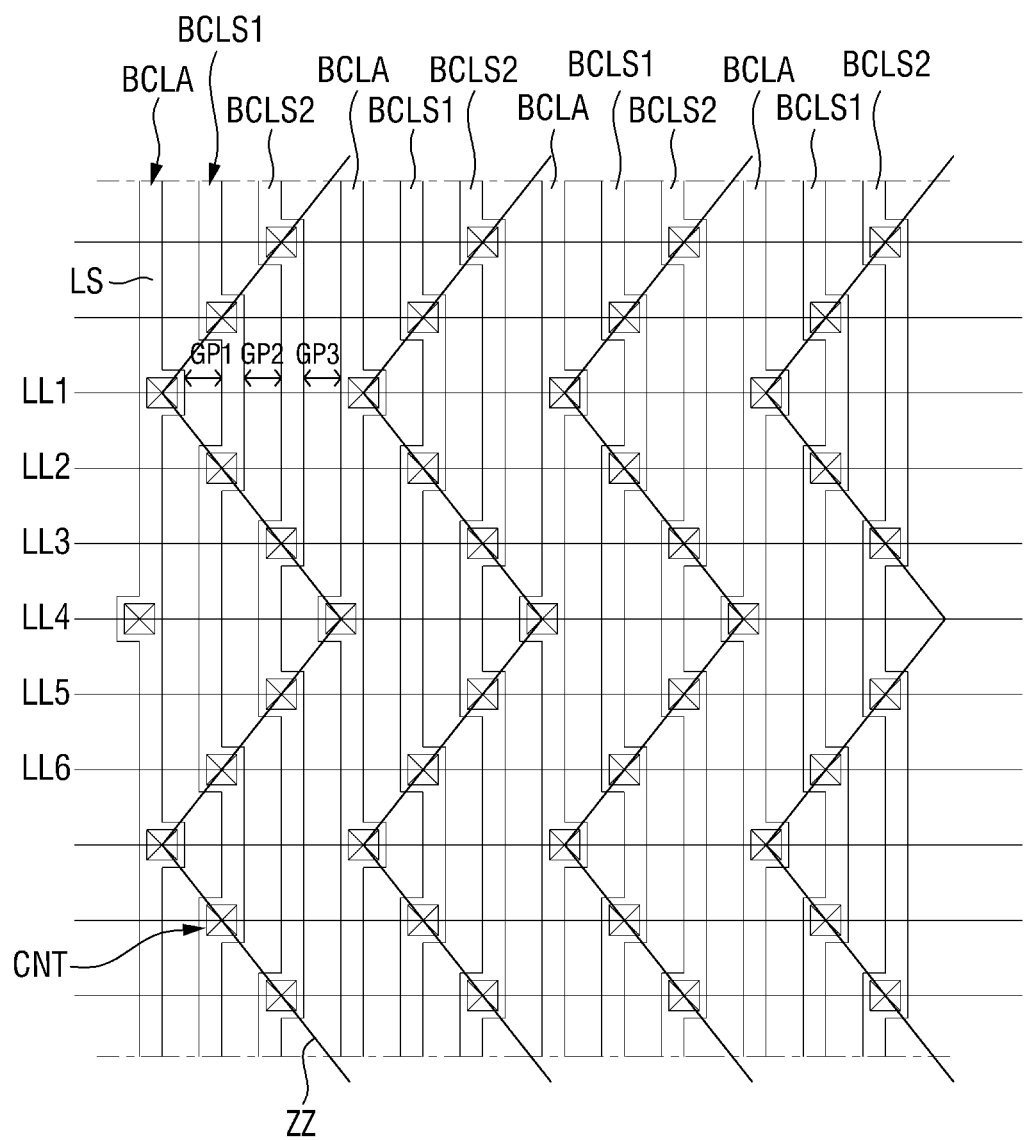
FIG. 6 is a view showing a layout of bending connection lines according to an exemplary embodiment of the present invention.
Figure 7B:
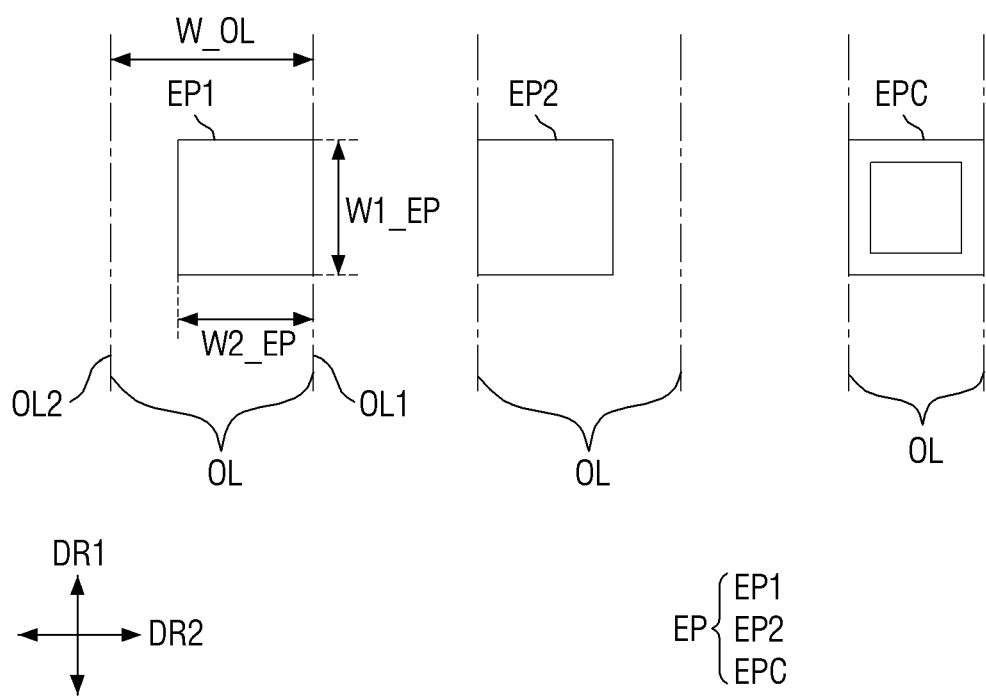
FIG. 7B is a view showing the positional relationship of expansion segments EP relative to an occupation line.

FIG. 6 is a view showing a layout of bending connection lines according to an exemplary embodiment of the present invention. FIG. 7A is a view showing the positional relationship of line segments LS relative to an occupation line. FIG. 7B is a view showing the positional relationship of extended segments EP relative to an occupation line.

In FIG. 6, a direction in which the bending connection lines are extended is defined as a first direction DR1, while a direction perpendicular to the first direction is defined as a second direction DR2. In a plan view, the upper side is referred to as one side of the first direction DR1, the lower side is referred to as the other side of the first direction DR1, the right side is referred to as one side of the second direction DR2, and the left side is referred to as the other side of the second direction DR2.

Referring to FIGS. 6, 7A, and 7B, each bending connection line BCL includes a plurality of line segments LS and a plurality of extended segments EP.

Each of the line segments LS are extended in the first direction DR1. The width of each of the line segments LS the second direction DR2 is referred to as the line width W_LS of the line segments LS. In an exemplary embodiment, the line width W_LS of each of the line segments LS may be constant regardless of its position. The width of each of the line segments LS in the first direction DR1 (length of each of the line segments) may vary.

Each of the extended segments EP is disposed between the line segments LS. The two line segments LS next to each other in the first direction DR1 are connected by an extended segment EP. The width of the extended segment EP in the first direction DR1 is referred to as a first width W1_EP, while the width in the second direction DR2 is referred to as a second width W2_EP. In some exemplary embodiments, the first width W1_EP and the second width W2_EP of the extended segment EP may be substantially equal to each other. The extended segments EP may be a substantially square shape. It is, however, to be understood that the inventive concepts are not limited thereto. The extended segments EP may have a rectangular shape with rounded corners or any other polygonal shape, and may have a circular or elliptical shape.

In an exemplary embodiment, the first width W1_EP and the second width W2_EP of the extended segment EP may be constant regardless of its position.

The second width W2_EP of the extended segments EP may be greater than the line width W_LS of the line segments LS. The first width W1_EP of the extended segment EP may be less than the width (length) of the line segments LS in the first segment DR1.

The extended segments EP are connected to the line segments LS such that one edge of the extended segment EP may be aligned with one edge of the line segment LS in the first direction DR1 while the other edge of the extended segment EP may protrude outwardly from the other edge of the line segment LS. For example, when one edge of the extended segment EP is aligned with one edge of the line segment LS, the other edge of the extended segment EP protrudes outwardly (toward the other side) from the other edge of the line segment LS. The width by which the extended segment EP protrudes from the line segment LS connected thereto may be equal to a value obtained by subtracting the line width W_LS of the line segment LS from the second width W2_EP of the extended segment EP.

The bending connection line BCL include the first connection line layer BCL_L1 and the second connection line layer BCL_L2 as described above, and the first connection line layer BCL_L1 and the second connection line layer BCL_L2 have substantially the same shape when viewed from the top and overlap with each other in the thickness direction. The line segments LS of the first connection line layer BCL_L1 and the line segments LS of the second connection line layer BCL_L2 overlapping with each other are spaced apart from each other with the fourth insulating layer 124 therebetween and may be electrically connected to each other via contacts CNT. The contacts CNT may be formed in the extended segments EP having a relatively large width. Therefore, even if some cracks are generated in the first connection line layer BCL_L1 or the second connection line layer BCL_L2 or the first connection line layer BCL_L1 or the second connection line layer BCL_L2 is disconnected, signals can be transmitted through the contacts CNT formed in the extended segments EP.

An imaginary line connecting in the first direction DR1 the protrusions of the bending connection line BCL in the second direction DR2 is defined as an occupation line OL. The occupation line OL of the bending connection line BCL includes a first edge OL1 located on one side and a second edge OL2 located on the other side. The first edge OL1 and the second edge OL2 of the occupation line OL may be parallel to each other while maintaining a constant gap W_OL therebetween. The first edge OL1 and the second edge OL2 of the occupation line OL may be straight lines.

A portion aligned with the edge of the occupation line OL is defined as a protrusion, while a portion spaced apart from the edge is defined as a recess. The protrusions and recesses of the bending connection line BCL may be arranged alternately on the edges in the first direction DR1. Some portions of the line may include both the protrusions and the recesses. For example, if a certain portion of the line is aligned with the first edge OL1 of the occupation line OL and is spaced from the second edge OL2, the line is described as being protruding toward one side and recessed from the other side.

The line segment LS and the extended segment EP may have various positions relative to the occupation line OL and may be referred with different names according to their relative positional relationship.

As shown in FIG. 7A, the line segments LS may include a first edge line segment LS1 which is in contact with the first edge OL1 and is spaced from the second edge OL2 of the occupation line OL, a second edge line segment LS2 which is in contact with the second edge OL2 and is spaced from the first edge OL1 of the occupation line OL, and a center line segment LSC which is spaced apart from the first and second edges OL1 and OL2 of the occupation line OL. The first edge of the first edge line segment LS1 is aligned with the first edge OL1 of the occupation line OL, and the second edge of the second edge line segment LS2 is aligned with the second edge of the occupation line OL. The center line segment LSC and the second edge line segment LS2 are recessed inwardly from the first edge OL1 of the occupation line OL. The center line segment LSC and the first edge line segment LS1 are recessed inwardly from the second edge OL2 of the occupation line OL.

As shown in FIG. 7B, the extended segments EP may include a first edge extended segment EP11 which is in contact with the second edge OL2 and is spaced from the first edge OL1 of the occupation line OL, a second edge extended segment EP2 which is in contact with the second edge OL2 and is spaced from the first edge OL1 of the occupation line OL, and a center extended segment EPC which is aligned with or spaced apart from both of the first and second edges OL1 and OL2 of the occupation line OL. The first edge of the first edge extended segment EP1 is aligned with the first edge OL1 of the occupation line OL, and the second edge of the second edge extended segment EP2 is aligned with the second edge OL2 of the occupation line OL. The second edge extended segment EP2 may be recessed inwardly from the first edge OL1 of the occupation line OL, and the first edge extended segment EP1 may be recessed from the second edge OL2 of the occupation line OL. In an exemplary embodiment, the first edge of the center extended segment EPC may be aligned with the first edge OL1 of the occupation line OL, while the second edge thereof may be aligned with the second edge OL2 of the occupation line OL.

The various kinds of line segments LS and extended segments EP described above may be combined in a variety of ways.

As shown in FIG. 6, the bending connection lines BCL may include reference connection lines BCLA in which the line segments LS are extended in a straight line, and swing connection lines BCLS in which line segments LS area extended in a zigzag pattern along the both edges OL1 and OL2 of the occupation line OL. The reference connection lines BCLA and the swing connection lines BCLS have different kinds of line segments LS and extended segments EP.

Figure 8:
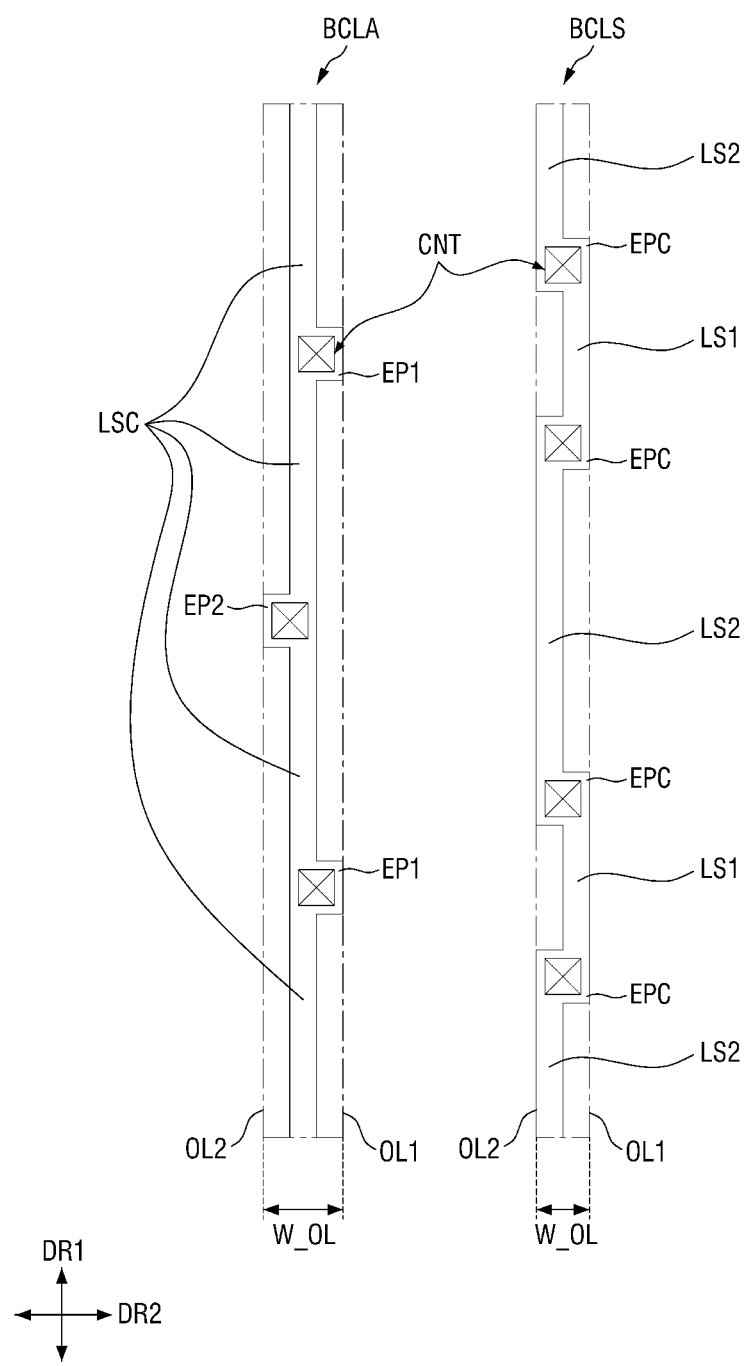
FIG. 8 is a plan view showing a reference connection line and a swing connection line.

FIG. 8 is a plan view showing a reference connection line and a swing connection line.

Specifically, for the reference connection line BCLA, the line segments LS are extended along a straight line in the first direction DR1, and the extended segments EP each between two of the line segments LS protrude from the line segments LS toward one or the other side in the second direction DR2.

The line segments LS of the reference connection line BCLA may be the center line segments LSC, while the extended segments EP thereof may be the first edge extended segment EP1 or the second edge extended segment EP2. The first edge extended segment EP1 and the second edge extended segment EP2 may be arranged alternately in the first direction DR1. The width W_OL of the occupation line OL of the reference connection line BCLA may be equal to a value obtained by subtracting the line width W_LS of the center line segment LSC from the sum of the second width W2_EP of the first edge extended segment EP1 and the second width W2_EP of the first edge extended segment EP1.

For the swing connection line BCLS, the extended segments EP are on a straight line, and the line segments LS are extended closer to either the first edge OL1 or the second edge OL2 of the occupation line OL.

The line segments LS of the swing connection line BCLS may be the first edge line segment LS1 or the second edge line segment LS2, while the extended segments EP thereof may be the center extended segment EPC. The first edge line segment LS1 and the second edge line segment LS2 may be arranged alternately in the first direction DR1. The width W_OL of the occupation line OL of the swing connection line BCLS may be equal to the second width W2_EP of the center extended segment EPC.

As described above, since the second width W2_EP of the extended segment EP is greater than the line width W_LS of the line segment LS, the width W_OL of the occupation line OL of the reference connection line BCLA may be greater than the width W_OL of the occupation line OL of the swing connection line BCLS.

Referring back to FIG. 6, the reference connection lines BCLA and the swing connection lines BCLS of the bending connection lines BCL may be arranged in turn in the second direction DR2. The reference connection lines BCLA and the swing connection lines BCLS may be repeated one by one. However, a single reference connection line BCLA and more than one swing connection lines BCLS as a repeating unit may be repeated in the second direction DR2. In this manner, by disposing more swing connection lines BCLS having a smaller width W_OL of the occupation line OL than the reference connection lines BCLA having a larger width W_OL of the occupation line OL, it is possible to reduce the overall width of the bending connection lines BCL. Furthermore, by disposing the lines such that protrusions face the recesses, the average distance between the lines can be reduced while maintaining a minimum gap between adjacent lines.

In the example shown in FIG. 6, one reference connecting line BCLA and two swing connecting lines BCLS form a repeating unit in the second direction DR2. For convenience of illustration, the swing connection line BCLS next to one side of the reference connection line BCLA in the second direction DR2 is referred to as a first swing connection line BCLS1, and the swing connection line next to the first swing connection line BCLS1 is referred to as a second swing connection line BCLS2. Another reference connection line BCLA is disposed next to the second swinging connection line BCLS2 in the second direction DR2.

The protrusions and the recesses of one of the bending connection lines BCL face the recesses and the protrusions of another bending connection line in the second direction DR2. As a protrusion faces a recess on a straight line in the second direction DR2, it is possible to reduce the area required for maintaining the minimum gap, compared to when a protrusion faces another protrusion. The gap between a protrusion and a recess facing each other may form the minimum gap between the adjacent lines. The minimum gap between the adjacent lines may be constant among the plurality of lines.

Specifically, FIG. 6 shows six straight lines LL1 to LL6 extended in the second direction DR2. The first to sixth straight lines LL1 to LL6 are sequentially arranged toward the other side of the first direction DR1. The first straight line LL1 traverses the first edge extended segments EP1 of the reference connection lines BCLA. The second straight line LL2 traverses the center extended segment EPC of the first swing connection line BCLS1. The third straight line LL3 traverses the center extended segment EPC of the second swing connection line BCLS2. The fourth straight line LL4 traverses the second edge extended segments EP2 of the reference connection lines BCLA. The fifth straight line LL5 traverses the center extended segment EPC of the second swing connection lines BCLS2. The sixth straight line LL6 traverses the center extended segment EPC of the first swing connection line BCLS1.

For the first straight line LL1 traversing the first edge extended segments EP1 of the reference connection lines BCLA, the first edge extended segments EP1 of the reference connection lines BCLA protruding toward one side face the first edge line segments LS1 of the first swing connection lines BCLS1 recessed from the other side, with a first gap GP1 therebetween. The first gap GP1 may be the minimum gap between the reference connection lines BCLA and the first swing connection lines BCLS1 next thereto.

Moreover, the first edge line segments LS1 of the first swing connection lines BCLS1 protruding toward one side along the first straight line LL1 face the first edge line segments LS1 of the second swing connection lines BCL2 relatively recessed from the other side, with a second gap GP2 therebetween. The second gap GP2 may be the minimum gap between the first swing connection lines BCLS1 and the second swing connection lines BCLS2 next thereto.

Subsequently, the second edge line segments LS2 of the second swing connection lines BCLS2 protruding toward one side along the first straight line LL1 face the first edge extended segments EP1 recessed from the other side of the reference connection line BCLA next thereto, with a third gap GP3 therebetween. The third gap GP3 may be the minimum gap between the second swing connection lines BCLS2 and the reference connection lines BCLA next thereto.

The second gap GP2 and the third gap GP3 may be equal to the first gap GP1.

For the second straight line LL2 traversing the center extended segments EPC of the first swing connection lines BCLS1, the center line segment LS2 of the reference connection lines BCLA recessed from one side is disposed on the other side, and the first edge line segments LS1 of the second swing connection lines BCLS2 recessed from the other side and the center line segments LS2 of the reference connection lines BCLA recessed from the other side are sequentially disposed on one side. The gap between the protrusions and the recesses facing each other along the second straight line LL2 may be constant and may be equal to the first gap GP1 described above.

For the third straight line LL3 traversing the center extended segments EPC of the second swing connection lines BCLS2, the first edge line segments of the first swing connection lines BCLS1 recessed from one side and the center line segments LS2 of the reference connection lines BCLA recessed from the one side are disposed sequentially in the other direction, and the center line segments LS2 of the reference connection lines BCLA recessed from the other side is disposed in one direction. The gap between the protrusions and the recesses facing each other along the third straight line LL3 may be constant and may be equal to the first gap GP1 described above.

For the fourth straight line LL4 traversing the second edge extended segments EP2 of the reference connection lines BCLA, the second edge line segments LS2 of the first swing connection lines BCLS1 protruding toward the other side, the second edge line segments LS2 of the second swing connection line BCLS2 protruding toward the other side and the second edge extended segments EP2 of the reference connection line BCLS protruding toward the other side are sequentially arranged in one direction of the second edge extended segments EP2 of the reference connection line BCLA recessed from one side. The gap between the protrusions and the recesses facing each other along the fourth straight line LL4 may be constant and may be equal to the first gap GP1 described above.

For the fourth straight line LL5 traversing the center extended segments EPC of the second swing connection lines BCLS2, like the above-described third straight line LL3, the first edge line segments of the first swing connection lines BCLS1 recessed from one side and the center line segments LS2 of the reference connection lines BCLA recessed from the one side are disposed sequentially in the other direction, and the center line segments LS2 of the reference connection line BCLA recessed from the other side is disposed in one direction. The gap between the protrusions and the recesses facing each other along the fifth straight line LL5 may be constant and may be equal to the first gap GP1 described above.

For the sixth straight line LL6 traversing the center extended segments EPC of the first swing connection lines BCLS1, like the above-described second straight line LL2, the center line segment LS2 of the reference connection line BCLA recessed from one side is disposed on the other side, and the first edge line segments LS1 of the second swing connection lines BCLS2 recessed from the other side and the center line segments LS2 of the reference connection line BCLA recessed from the other side area sequentially disposed on one side. The gap between the protrusions and the recesses facing each other along the sixth straight line LL6 may be constant and may be equal to the first gap GP1 described above.

The above-described arrangement may be repeated in the first direction DR1.

In the above-described arrangement, the extended segments EP are not disposed adjacent to one another in the second direction DR2. In addition, a straight line traversing a single extended segment EP may traverse another extended segment EP for every three lines, which is the repeating unit in the second direction DR2.

A straight line traversing the extended segments EP in the second direction DR2 is defined as a row of the extended segments EP. The extended segments EP may then be arranged in a zigzag pattern ZZ, with an oblique line in each of the rows. The zigzag pattern ZZ may have an oblique shape connecting the first edge extended segments EP1 with the second edge extended segments EP2 of adjacent reference connection lines BCLA. The center extended segment EPC of the first swing connection line BCLS1 and the center extended segment EPC of the second swing connection line BCLS2 may be arranged on oblique lines defining the zigzag pattern ZZ. One oblique line may be repeated every three rows, and two oblique lines completing a zigzag pattern ZZ may be repeated every six rows.

Since the rows of the extended segments EP have the zigzag pattern ZZ, the line segments LS connecting the extended segments EP with one another may have different lengths (widths in the first direction DR1). For example, the center line segments LS2 of the reference connection lines BCLA may have the same length, whereas the length of the first edge line segments LS1 of the first swing connection lines BCLS1 may be greater than the length of the center line segments LS2, and the length of the second edge line segments LS2 may be less than the center line segments LS2. On the other hand, the length of the first edge line segments LS1 may be less than the length of the center line segments LS2 whereas the length of the second edge line segments LS2 may be greater than the length of the center line segments LS2.

In an exemplary embodiment, each of the recesses may completely cover the respective protrusions in the first direction DR1. The lengths of the recesses in the first direction DR1 may be greater than the lengths of the protrusions in the first direction DR1.

As described above, according to this exemplary embodiment of the present invention, an extended segment EP having a relatively large width is not disposed next to another extended segment EP in the second direction DR2. When the extended segment EP forms a protrusion, a line segment LS forming a recess is disposed next to the extended segment EP. In this manner, each of the protrusions faces the respective recesses at the facing edges of the lines in the second direction DR2, repeatedly. As a result, it is possible to achieve an optimum gap between adjacent lines, and a large number of lines can be disposed per unit area.

Figure 9:
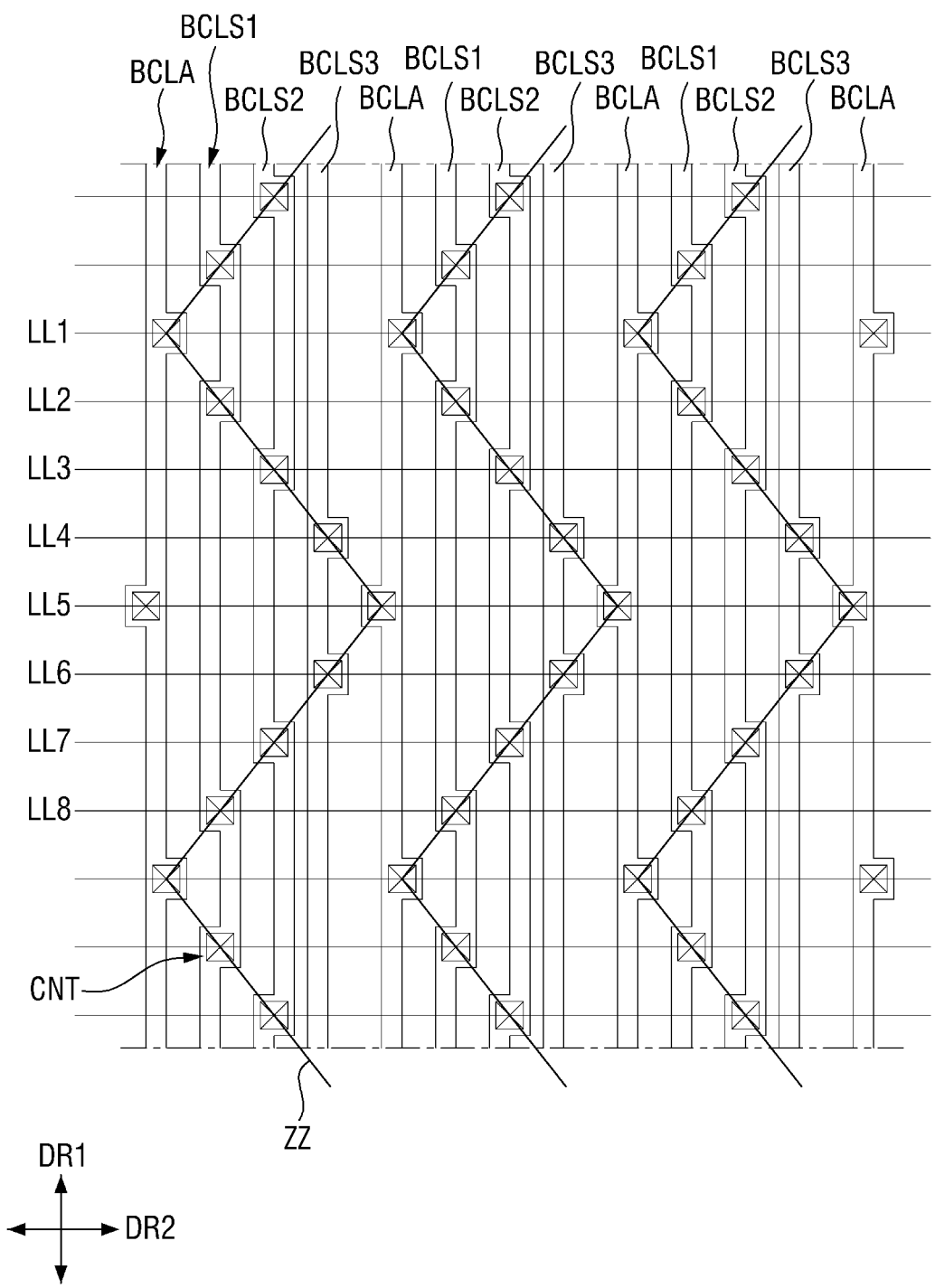
FIG. 9 is a view showing a layout of bending connection lines according to another exemplary embodiment of the present invention.

FIG. 9 is a view showing a layout of bending connection lines according to another exemplary embodiment of the present invention.

Bending connection lines BCL according to the exemplary embodiment shown in FIG. 9 are different from those according to the exemplary embodiment shown in FIG. 6 in that a single reference connection line BCLA and three swing connection lines BCLS arranged in the second direction DR2 form a repeating unit.

Specifically, a first swing connection line BCLS1, a second swing connection line BCLS2 and a third swing connection line BCLS3 are sequentially arranged from one side of the reference connection line BCLA in the second direction DR2. In this exemplary embodiment of the present disclosure, four lines arranged in the second direction DR2 form a repeating unit. Accordingly, the rows of the extended segments EP have a zigzag pattern Z-AXIS. An oblique line of the zigzag pattern ZZ is repeated for every four rows (LL1 to LL4, LL5 to LL8). Two oblique lines that complete the zigzag pattern ZZ may be repeated, with eight rows (LL1, LL2, LL3, LL4, LL5, LL6, LL7 and LL8) as a repeating unit. As the number of rows completing the zigzag pattern ZZ increases as compared to the exemplary embodiment shown in FIG. 5, the maximum length of the line segments LS (e.g., the second edge line segment LS2 of the first swing connection line BCLS1 and/or the first edge line segment LS1 of the third swing connection line BCLS3) may become longer.

According to this exemplary embodiment, like the exemplary embodiment shown in FIG. 5, the protrusions face the respective recesses at the adjacent edges in the second direction DR2 between adjacent lines. Therefore, the line density per unit area can be increased. Further, according to this exemplary embodiment, the swing connection lines BCLS having a smaller width W_OL of the occupation line OL can be disposed more than the reference connection lines BCLA having a larger width W_OL of the occupation line OL, so that it is possible to dispose a larger number of lines in the given width in the second direction DR2.

It is to be understood from the above-described exemplary embodiment that the number of the swing connection lines BCLS included in a repeating unit including one reference connection line BCLA is not limited to one, two, or three but may be four, five, etc. It is, however, to be noted that the maximum length of the line segments LS becomes larger as the number of swing connection lines BCLS included in a single repeating unit increases. If the length of the bending connection lines BCL in the first direction DR1 is limited, no extended segment EP may be disposed in some connection lines. If no extended segment EP is disposed or the line segment LS becomes too long, it may be difficult to perform the multi-path functionality properly. Therefore, the number of swing connection lines BCLS to be included in a repeating unit may be determined based on such issues.

Figure 10:
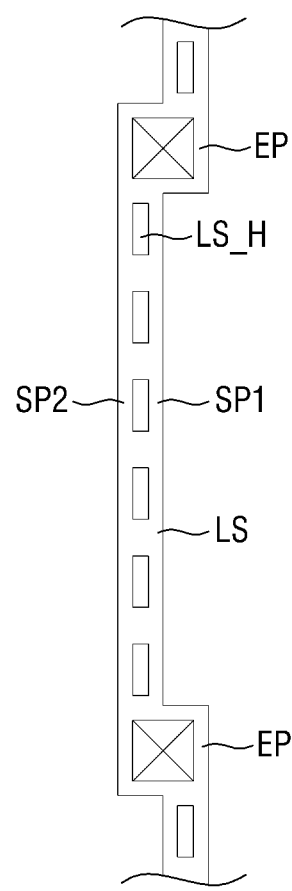
FIG. 10 is a view showing a bending connection line according to yet another exemplary embodiment of the present invention.
Figure 10:
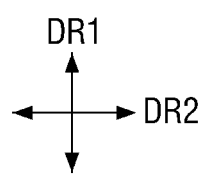

FIG. 10 is a view showing a bending connection line according to yet another exemplary embodiment of the present invention. The line segment LS shown in FIG. 10 includes one or more holes therein.

Referring to FIG. 10, the line segment LS includes holes LS_H at its center portion in the second direction DR2. A plurality of holes LS_H may be arranged in the first direction DR1 of the line segment LS. Each of the holes LS_H is surrounded by a conductive material of the line segment LS. Although the holes LS_H may have a rectangular shape having longer sides in the first direction DR1 as shown in FIG. 10, this is merely illustrative. The holes LS_H may have any of a variety of shapes such as a square, a rectangle having rounded corners, a circle, or an ellipse.

The holes LS_H of the line segment LS can reduce the bending stress of the bending connection line BCL. In addition, the line segment LS includes a first signal path SP1 on one side of the holes LS_H and a second signal path SP2 on the other side thereof in the second direction DR2. Accordingly, even if the first signal path SP1 is disconnected, a signal can still be transmitted via the second signal path SP2, to achieve a multi-path structure.

The first signal line SL1 and/or the second signal line SL2 of the bending connection line BCL may include the line segment LS including the holes LS_H as shown in FIG. 10. Therefore, the bending connection line BCL has the multi-path structure not only by the line layers in the thickness direction but also by the first signal path SP1 and the second signal path SP2 on a plane, thereby suppressing disconnection of the signal lines in the panel bending region BR.

In an exemplary embodiment, the line segments LS of the first signal line SL1 as well as the line segments LS of the second signal line SL2 may include holes LS_H. In this example, the holes in the line segments LS1 of the first signal line SL1 may completely overlap with the holes in the line segments LS of the second signal line SL2 in the thickness direction. It is, however, to be understood that the inventive concepts are not limited thereto. That is to say, the holes in the line segments LS of the first signal line SL1 and the holes in the line segments LS of the second signal line SL2 may partially overlap with each other in the thickness direction or may not overlap with each other.

According to exemplary embodiments of the invention, a multi-path structure can be implemented in the bending region in which a large number of lines can be disposed within a limited width.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising: a substrate comprising a first region, a second region, and a bending region disposed between the first region and the second region; and a plurality of bending connection lines disposed on the substrate in the bending region and extended in a first direction, wherein: each of the bending connection lines comprises a protrusion in a second direction and a recess depressed from the protrusion; the protrusion of each of the bending connection lines faces the recess of the bending connection lines next thereto, each of the bending connection lines comprises a first connection line layer and a second connection line layer; an insulating layer is interposed between the first connection line layer and the second connection line layer; the second connection line layer is connected to the first connection line layer via a contact which penetrates the insulating layer, the contact being positioned in the bending region; and the first connection line layer and the second connection line layer have a same shape when viewed in a plan view and overlap with each other in a thickness direction, wherein: each of the bending connection lines comprises: a line segment having a first width in the second direction; and an extended segment having a second width in the second direction; and the second width is greater than the first width.

2. The display device of claim 1, wherein the contact connecting the first connection line layer with the second connection line layer is disposed in the extended segment.

3. The display device of claim 1, wherein:
the first region comprises a thin-film transistor and a data line;
the first connection line layer is made of a same conductive material as a first electrode of the thin-film transistor; and
the second connection line layer is made of a same conductive material as the data line.

4. The display device of claim 3, wherein each of the first connection line layer and the second connection line layer comprises aluminum.

5. The display device of claim 1, wherein: each of the bending connection lines comprises a plurality of the line segments and a plurality of the extended segments; and the line segments and the extended segments are arranged in turn in the first direction.

6. The display device of claim 5, wherein:
each of the line segments is connected to the respective extended segments such that a first edge of each of the line segments is aligned with a first edge of the respective extended segments in the first direction; and
a second edge of each of the extended segments protrudes from a second edge of the respective line segments in the second direction.

7. The display device of claim 5, wherein:
each of the line segments comprises at least one hole therein; and
each of the line segments comprises a first signal path on one side of the hole and a second signal path on an opposite side of the hole in the second direction.

8. A display device comprising:
a substrate comprising a first region, a second region, and a bending region disposed between the first region and the second region; and
a plurality of bending connection lines disposed on the substrate in the bending region and extended in a first direction,
wherein:
each of the bending connection lines comprises:
a line segment having a first width in a second direction intersecting with the first direction; and
an extended segment having a second width in the second direction greater than the first width;
the bending connection lines are arranged in the second direction;
the plurality of bending connection lines include a reference connection line, a first swing connection line, and a second swing connection line;
the first swing connection line being disposed adjacent to one side of the reference connection line in the second direction and the second swing connection line being disposed adjacent to one side of the first swing connection line in the second direction;
the reference connection line comprises a center line segment spaced apart from a first edge and a second edge of an occupation line of the reference connection line;
the first swing connection lines comprises a first center extended segment aligned with a first edge and a second edge of an occupation line of the first swing connection line;

the second swing connection lines comprises a second center extended segment aligned with a first edge and a second edge of an occupation line of the second swing connection line;

the occupation line of the reference connection line is occupied by the reference connection line in the first direction and the second edge is opposite to the first edge, a first edge extended segment aligned with the first edge and spaced apart from the second edge of the occupation line of the reference connection line, and a second edge extended segment aligned with the second edge and spaced apart from the first edge of the occupation line of the reference connection line;

the occupation line of the first swing connection line is occupied by the first swing connection line in the first direction and the second edge is opposite to the first edge, a first edge line segment aligned with the first edge and spaced apart from the second edge of the occupation line of the first swing connection line, and a second edge line segment aligned with the second edge and spaced apart from the first edge of the occupation line of the first swing connection line; and the occupation line of the second swing connection line is occupied by the second swing connection line in the first direction and the second edge is opposite to the first edge, a first edge line segment aligned with the first edge and spaced apart from the second edge of the occupation line of the second swing connection line, and a second edge line segment aligned with the second edge and spaced apart from the first edge of the occupation line of the second swing connection line.

9. The display device of claim 8, wherein:
the first edge and the second edge of the occupation line of the reference connection line are parallel to each other;
the first edge and the second edge of the occupation line of the first swing connection line are parallel to each other; and
the first edge and the second edge of the occupation line of the second swing connection line are parallel to each other.

10. The display device of claim 9, wherein a width of the occupation line of the reference connection line is greater than widths of the occupation line of the first swing connection line and the occupation line of the second swing connection line.

11. The display device of claim 8, wherein, along a first straight line traversing the first edge extended segment of the reference connection line to be extended in the second direction, the first edge extended segment of the reference connection line faces the first edge line segment of the first swinging connection line on one side thereof, and the first edge line segment of the first swing connection line faces the first edge line segment of the second swing connection line on one side thereof.

12. The display device of claim 11, wherein, along a second straight line traversing the first center extended segment of the first swing connection line to be extended in the second direction, the first center extended segment of the first swing connection line faces the first edge line segment of the second swing connection line on one side thereof, and faces the center line segment of the reference connection line on the other side thereof.

13. The display device of claim 12, wherein, along a third straight line traversing the first center extended segment of the second swing connection line to be extended in the second direction, the second center extended segment of the second swing connection line faces the second edge line segment of the first swing connection line on the other side thereof, and the second edge line segment of the first swing connection line faces the center line segment of the reference connection line on the other side thereof.

14. The display device of claim 11, wherein a gap between the first edge extended segment of the reference connection line and the first edge line segment of the first swing connection line facing each other along the first straight line is equal to a gap between the first edge line segment of the first swing connection line and the first edge line segment of the second swing connection line facing each other along the first straight line.

15. The display device of claim 8, wherein the reference connection line, the first swing connection line, and the second swing connection line are repeatedly arranged in the second direction.

16. The display device of claim 8, further comprising a third swing connection line disposed adjacent to one side of the second swing connection line in the second direction.

17. The display device of claim 8, wherein:
each of the bending connection lines comprises a first connection line layer and a second connection line layer electrically connected to the first connection line layer through a contact; and
the first connection line layer is electrically connected to the second connection line layer through the contact in the extended segment.

* * * * *